United States Patent
Okugaki et al.

[11] Patent Number: 5,811,862
[45] Date of Patent: Sep. 22, 1998

[54] SEMICONDUCTOR DEVICE HAVING A MASK PROGRAMMABLE MEMORY AND MANUFACTURING METHOD THEREOF

[75] Inventors: Akira Okugaki; Shinichi Mori; Kenji Koda; Hiromi Sadaie, all of Hyogo, Japan

[73] Assignees: Mitsubishi Denki Kabushiki Kaisha, Tokyo; Mitsubishi Electric Semiconductor Software Corporation, Hyogo, both of Japan

[21] Appl. No.: 963,118

[22] Filed: Oct. 28, 1997

Related U.S. Application Data

[63] Continuation of Ser. No. 528,873, Sep. 15, 1995, abandoned.

[30] Foreign Application Priority Data

Nov. 29, 1994 [JP] Japan ................................ 6-294736

[51] Int. Cl.$^6$ ........................... H01L 29/76; H01L 29/94; H01L 31/062; H01L 31/113
[52] U.S. Cl. ........................... 257/390; 257/408; 257/336; 365/189.01
[58] Field of Search ................................ 257/336, 337, 257/368, 390, 408; 365/189.01

[56] References Cited

U.S. PATENT DOCUMENTS

| | | |
|---|---|---|
| 4,847,808 | 7/1989 | Kobatake . |
| 5,117,389 | 5/1992 | Yiu .......................... 365/104 |
| 5,258,958 | 11/1993 | Iwahashi et al. ...................... 365/210 |
| 5,328,863 | 7/1994 | Cappelletti et al. ...................... 437/52 |
| 5,432,103 | 7/1995 | Miller ........................................ 437/29 |

FOREIGN PATENT DOCUMENTS

| | | |
|---|---|---|
| 52-26129 | 2/1977 | Japan ..................................... 257/390 |
| 61-27673 | 2/1986 | Japan . |
| 62-194662 | 8/1987 | Japan . |
| 63-64361 | 3/1988 | Japan . |
| 3-80497 | 4/1991 | Japan . |
| 5-152547 | 11/1991 | Japan . |
| 4-119665 | 4/1992 | Japan . |
| 6-37284 | 7/1992 | Japan . |
| 6-318683 | 1/1993 | Japan . |

OTHER PUBLICATIONS

German Office Action dated Feb. 12, 1997 and translation thereof.

*Primary Examiner*—Wael Fahmy
*Assistant Examiner*—Howard Weiss
*Attorney, Agent, or Firm*—McDermott, Will & Emery

[57] ABSTRACT

A semiconductor device having a multi-value memory including an offset ROM and a manufacturing method thereof can be obtained which allows accurate formation of a source/drain region and an offset region. In this semiconductor device, an offset source/drain region is provided so that a side end portion thereof is positioned substantially in flush with a lower end of an external surface of a sidewall insulating film placed on a side surface of a first gate electrode. Consequently, the offset source/drain region can be formed easily in a self-aligned manner by ion implantation using the sidewall insulating film as a mask, thereby forming the offset region accurately in a self-aligned manner.

2 Claims, 18 Drawing Sheets

6 5 3 7 2 5   6 5 3 7 2 5   6 5 3 7 2 5   6 5 3 7 2 5   1

6 5 3 7 2 5   6 5 3 7 2 5   6 5 3 7 2 5   6 5 3 7 2 5   1

SEMICONDUCTOR DEVICE HAVING A MASK PROGRAMMABLE MEMORY AND MANUFACTURING METHOD THEREOF

This application is a continuation of application Ser. No. 08/528,873 filed Sep. 15, 1995, now abandoned.

BACKGROUND OF THE INVENTION

1. Field of the Invention

The present invention relates to semiconductor devices and manufacturing methods thereof, and more particularly, to a semiconductor device having a mask programmable memory and a manufacturing method thereof.

2. Description of the Background Art

Mask programmable memories have been known to include NOR memories and NAND memories. An NOR memory is formed by connecting in parallel the sources and the drains of memory transistors respectively, and an NAND memory is formed by connecting in series the sources and the drains of memory transistors respectively. FIG. 30 is an equivalent circuit diagram of a conventional NOR memory, and FIG. 31 is a plan view of the conventional NOR memory corresponding to FIG. 30. FIG. 32 is a cross sectional view taken along the line 150—150 in FIG. 31.

Referring to FIG. 30, in the conventional NOR memory, transistors 151 and 152 each have one terminal connected to a source line 108, which is in turn connected to the ground, and the other conductive terminal connected to a bit line 107. Transistors 151 and 152 also have gate electrodes connected to respective word lines 103. When word line 103 attains an H (High) level, transistor 152 turns on, but transistor 151 does not because it has a high threshold. Data is stored in a conventional NOR memory by thus making a difference in threshold voltage between transistors 151 and 152.

As shown in FIGS. 31 and 32, a field oxide film 104 is formed with a prescribed distance on a main surface of a p type semiconductor substrate 101 in a conventional NOR memory. An n type impurity region 106 is formed with a prescribed distance in an active region surrounded by field oxide films 104. In a channel region of transistor 151, a p type impurity region 112 having a higher impurity concentration than p type semiconductor substrate 101 is formed, thereby setting higher the threshold voltage of transistor 151. On the channel region of transistor 151, a gate electrode 103 is formed with a gate oxide film 102 interposed therebetween, and also on the channel region of transistor 152, gate electrode 103 is formed with gate oxide film 102 interposed therebetween.

An interlayer insulating film 105 is formed to cover the entire surface, at a prescribed region of which film, a contact hole is formed. Bit line 107 and source line 108 are formed in the contact holes to connect to n type impurity region 106. A protection film 113 is formed to cover bit line 107, source line 108 and interlayer insulating film 105. Since transistors are separated by field oxide films 104 in such a conventional NOR memory, a memory array will have a large area and this gives rise to a problem when a transistor is miniaturized.

Therefore, a virtual GND NOR memory has been proposed in which transistors are separated by ion implantation. This virtual GND NOR memory has a smaller area for a memory array than the above-described NOR memory because transistors are separated by utilizing ion implantation regions.

However, with an increase in memory capacity in these years, memory array area is undesirably increased even in a virtual GND NOR memory.

Meanwhile, multi-value storage of a memory transistor has also been proposed as an approach for suppressing increase in area with the increase in memory capacity. In accordance with this approach, four values, instead of the conventional two, are stored in one transistor. As an example of a memory transistor having four values, a transistor with an offset has been proposed. By providing an offset between a channel region and a source/drain region of a memory transistor, this transistor stores four values by combination of reading methods and presence/absence of an offset.

FIG. 33 is a cross sectional view showing a conventional offset transistor. Referring to FIG. 33, in the conventional offset transistor, n type regions 203 and 204 are provided with a prescribed distance therebetween on a main surface of p type semiconductor substrate 201, sandwiching a channel region 202. A gate electrode 206 is formed on channel region 202 with a gate insulating film 205 therebetween. In this conventional offset transistor, n type region 204 is formed by ion implantation using a prescribed resist mask so as to provide an offset region 207. As a result, it has been difficult to form n type region 204 at the exact position as designed because of, for example, misalignment of the mask, and therefore difficult to form offset 207 with good accuracy.

In addition, if the offset transistor implementing the multi-value memory is applied to, for example, the above-described conventional NOR memory cell, memory array area will be undesirably large because of separation by field oxide films 104.

SUMMARY OF THE INVENTION

One object of the present invention is to provide a semiconductor device which allows easy and accurate formation of an offset region and a source/drain region of an offset transistor capable of implementing a multi-value memory.

Another object of the present invention is to provide a semiconductor device including a multi-value memory with a small memory array area.

A further object of the present invention is to provide a method of manufacturing a semiconductor device which makes it possible to form accurately a source/drain region and an offset region of an offset transistor capable of implementing a multi-value memory.

A semiconductor device according to one aspect of the present invention includes a semiconductor substrate, a plurality of first gate electrodes, a sidewall insulating film, an offset source/drain region, a data injection layer, and a second gate electrode. The semiconductor substrate has a main surface. The first gate electrodes are formed with a prescribed distance therebetween on the main surface of the semiconductor substrate. The sidewall insulating films are formed in contact with both side surfaces of each of the plurality of first gate electrodes. A plurality of the offset source/drain regions are formed at the main surface of the semiconductor substrate with a prescribed distance therebetween so that a side end thereof is positioned substantially in line with a lower end portion of an external surface of the sidewall insulating film. The offset source/drain region is of a first conductivity type. The data injection layer is formed at an offset portion located in a data injection portion between the offset source/drain region and the first gate electrode, and is of the first conductivity type. The second gate electrode is formed in contact with upper surfaces of the plurality of first gate electrodes.

Since the semiconductor device has the structure described above, the offset source/drain region can be formed easily in a self-aligned manner by ion implantation using the sidewall insulating film as a mask. Since the data injection layer is provided at the offset portion as described above, the data injection layer is formed in a self-aligned manner using the first gate electrode as a data injection mask. Consequently, the offset source/drain region and the data injection layer can be formed easily with good accuracy.

A semiconductor device according to another aspect of the present invention includes a semiconductor substrate, a plurality of first gate electrodes, a sidewall insulating film, and a source/drain region. The sidewall insulating film is formed in contact with a side surface of the first gate electrode only on the side corresponding to a region where an offset is to be formed. The source/drain region is formed so that its side end portions are positioned at the main surface of the semiconductor substrate and in line with a lower end portion of an external surface of the sidewall insulating film and with the side surface of the first gate electrode.

Since this semiconductor device have such a structure as described above, the source/drain region can be formed easily in a self-aligned manner by ion implantation using the sidewall insulating film and the first gate electrode as a mask. Consequently, the offset region and the source/drain region can be formed easily with good accuracy.

A semiconductor device according to a further aspect of the present invention includes a semiconductor substrate, a first gate electrode, a source/drain region, and a second gate electrode. A plurality of the first gate electrodes are formed with a prescribed distance therebetween on a main surface of the semiconductor substrate. The first gate electrode corresponding to an offset region has a shorter length in the direction of its channel length than the first gate electrode which does not correspond to an offset region. A plurality of the source/drain regions are formed sandwiching the first gate electrode and spaced apart by the distance substantially equal to the length of the first gate electrode which does not correspond to an offset region in the direction of its channel length, and have substantially the same length in the direction of the channel length.

Since this semiconductor device has the structure above, the source/drain region can be formed in a self-aligned manner by forming the source/drain region through ion implantation using the first gate electrode as a mask and making shorter the width of the first gate electrode corresponding to an offset region.

A semiconductor device according to a further aspect of the present invention includes a semiconductor substrate, a first gate electrode, a source/drain region, and an offset region. A plurality of the source/drain regions are formed with a prescribed distance therebetween at a main surface of the semiconductor substrate, sandwiching a plurality of the first gate electrodes. The source/drain region is of a first conductivity type and formed so that a side end portion thereof is substantially in line with a side surface of the first gate electrode. The offset region is of a second conductivity type and formed near the boundary region, corresponding to a region for forming an offset, between the first gate electrode and the source/drain region. Preferably, the offset region can be formed so that a side end surface thereof is substantially in line with a side surface of the first gate electrode.

Since the semiconductor device has such a structure as above, the source/drain region can be formed easily in a self-aligned manner by ion implantation using the first gate electrode as a mask. As the offset region is formed near the boundary region between the first gate electrode and the source/drain region, the offset region can be formed in a self-aligned manner using the first gate electrode as an offset injection mask.

A semiconductor device according to a further aspect of the present invention includes a memory cell array, a word line, first and second conductive lines, a column selection circuit, first and second readout circuits, and first and second ground circuits. Memory cell array includes a plurality of offset memory cells arranged in column and row directions and having one and the other conductive terminals and a gate. Each word line is connected to gates of memory cells in a row. The first conductive line is arranged corresponding to each line and connected to each of the one conductive terminals of a plurality of memory cells in the corresponding column. The second conductive line is arranged corresponding to each column, and connected to each of the other conductive terminals of a plurality of memory cells in the corresponding column. Column selection circuit selects one of a plurality of columns by a column selection signal. The first readout circuit is responsive to a first readout indication signal and reads out data of the first conductive line of the column selected by the column selection circuit. The first ground circuit is responsive to the first readout indication signal and connects to the ground the second conductive line of the selected column. The second readout circuit is responsive to a second readout indication signal and reads out data of the second conductive line of the column selected by the column selection circuit. The second ground circuit is responsive to the second readout indication signal and connects the first conductive line of the selected column to the ground.

Since the semiconductor device has the structure above, data can be read in two directions, that is, from the one and the other conductive terminals of one memory cell transistor. As a result, a multi-value readout can be achieved utilizing an offset memory cell transistor.

In a method of manufacturing a semiconductor device according to a further aspect of the present invention, a first gate electrode is formed with a prescribed distance on a main surface of a semiconductor substrate. A sidewall insulating film is formed in contact with a surface of both sides of the first gate electrode. An offset source/drain region of a first conductivity type is formed by implanting ions of impurity to the main surface of the semiconductor substrate using the sidewall insulating film as a mask. Using the first gate electrode located in a data injection portion as a mask, ions of impurity are implanted to the main surface of the semiconductor substrate through the sidewall insulating film, thereby forming a data injection layer of the first conductivity type.

As a result, in accordance with the above manufacturing method, an offset source/drain region can be easily formed in a self-aligned manner. Since the data injection layer is formed in the manner above, it can also be formed in a self-aligned manner.

In a method of manufacturing a semiconductor device according to a further aspect of the present invention, a first gate electrode is formed with a prescribed distance on a main surface of a semiconductor substrate. A sidewall insulating film is formed in contact with a surface of both sides of the first gate electrode. Thereafter, the sidewall insulating film in contact with the side surface of the first gate electrode on the side corresponding to a data injection region is removed. Using the remaining sidewall insulating film and the first gate electrode as a mask, ions of impurity are implanted to the main surface of the semiconductor substrate to form a source/drain region.

As a result, a source/drain region having an offset region can be formed in a self-aligned manner in accordance with this manufacturing method.

In a method of manufacturing a semiconductor device according to a further aspect of the present invention, a first gate electrode is formed with a prescribed distance on a main surface of a semiconductor substrate. Using the first gate electrode as a mask, ions of impurity are implanted onto the main surface of the semiconductor substrate to form a source/drain region. An offset region is formed by removing a sidewall portion of the first gate electrode positioned in an offset formation region by a prescribed length in the direction of its channel length.

Consequently, a source/drain region can be formed in a self-aligned manner in accordance with this manufacturing method of a semiconductor device.

In a method of manufacturing a semiconductor device according to a further aspect of the present invention, a first gate electrode is formed with a prescribed distance on a main surface of a semiconductor substrate. Using the first gate electrode as a mask, ions of impurity are implanted onto the main surface of the semiconductor substrate to form a source/drain region of a first conductivity type. Ions of impurity are implanted to a region near a side surface of the first gate electrode corresponding to an offset formation region by using the first gate electrode as a mask, thereby forming an offset region of a second conductivity type.

In accordance with the manufacturing method above, both of the source/drain region and the offset region can be formed easily in a self-aligned manner.

In a method of manufacturing a semiconductor device according to a further aspect of the present invention, a first gate electrode is formed with a prescribed distance on a main surface of a semiconductor substrate. Ions of impurity are implanted to the semiconductor substrate using the first gate electrode as a mask, thereby forming an offset injection layer of a first conductivity type. A sidewall insulating film is formed in contact with a side surface of both sides of the first gate electrode. Using the sidewall insulating film as a mask, ions of impurity are implanted to the main surface of the semiconductor substrate to form a source/drain region of a second conductivity type. Using the first gate electrode positioned in a data injection portion as a mask, ions of impurity are implanted to the main surface of the semiconductor substrate through the sidewall insulating film, thereby forming a data injection region of the second conductivity type.

In this manufacturing method, the data injection region, the offset region and the source/drain region can thus be formed easily in a self-aligned manner.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiments of the present invention will be described below with reference to the drawings.

Referring to FIGS. 1–7, a process for manufacturing a semiconductor device in accordance with a first embodiment will be described.

Figure 1:
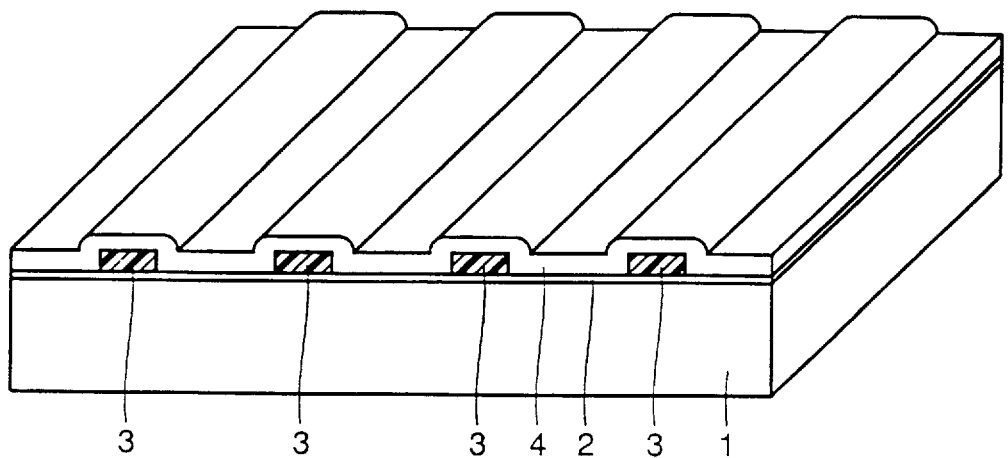
FIGS. 1–5 are perspective views illustrating first through fifth steps, respectively, of a process for manufacturing a memory cell array portion including an offset ROM of a semiconductor device in accordance with a first embodiment of the present invention.
Figure 2:
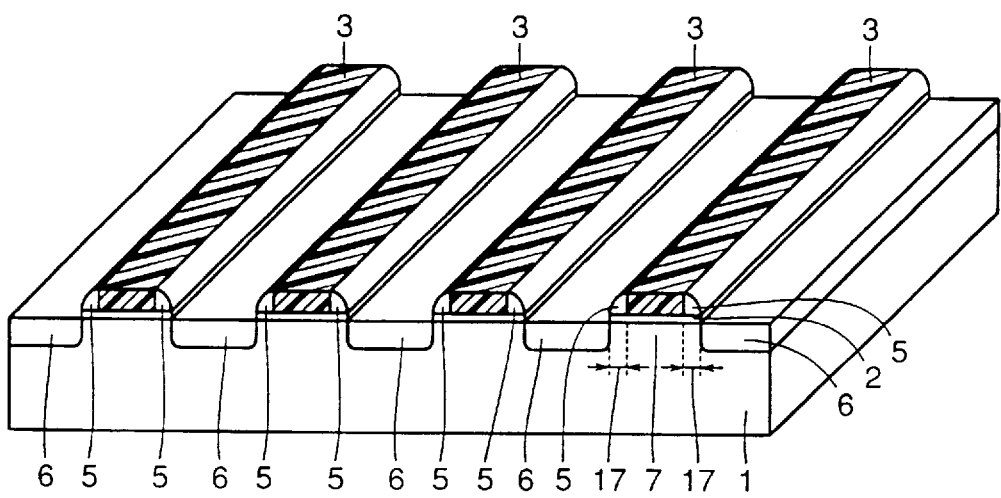

As shown in FIG. 1, on a P type semiconductor substrate 1, a gate insulating film 2 is formed, on which a first gate electrode 3 is formed with a prescribed distance and extending in a prescribed direction. An interlayer insulating film 4 is formed to cover first gate electrode 3 and gate insulating film 2. By anisotropically etching interlayer insulating film 4, a sidewall insulating layer 5 is formed in contact with both side surfaces of gate electrode 3 as shown in FIG. 2. Using sidewall insulating layer 5 as a mask, ions of n type impurity (phosphorus or arsenic) are implanted to p type semiconductor substrate 1 to form an n type diffusion region 6 in a self-aligned manner. Since a side end portion of n type diffusion region 6 is positioned in line with a lower end of a side surface of sidewall insulating layer 5, an offset 17 can be formed in a self-aligned manner in a channel region 7 located under gate electrode 3.

Figure 3:
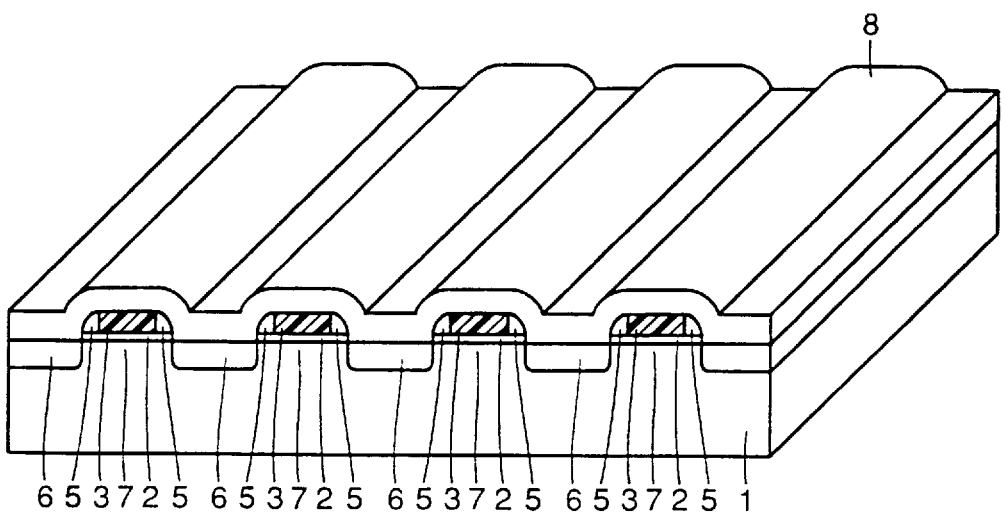
Figure 4:
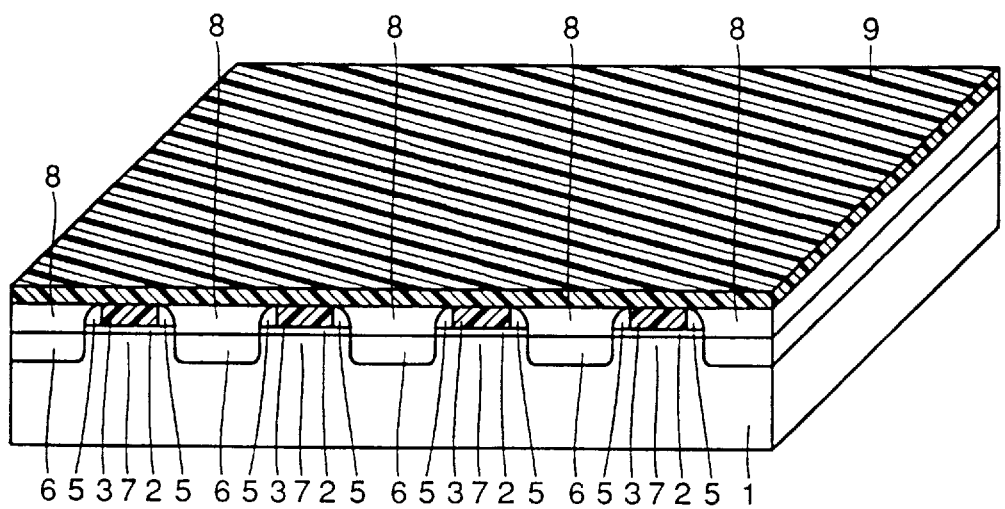
Figure 5:
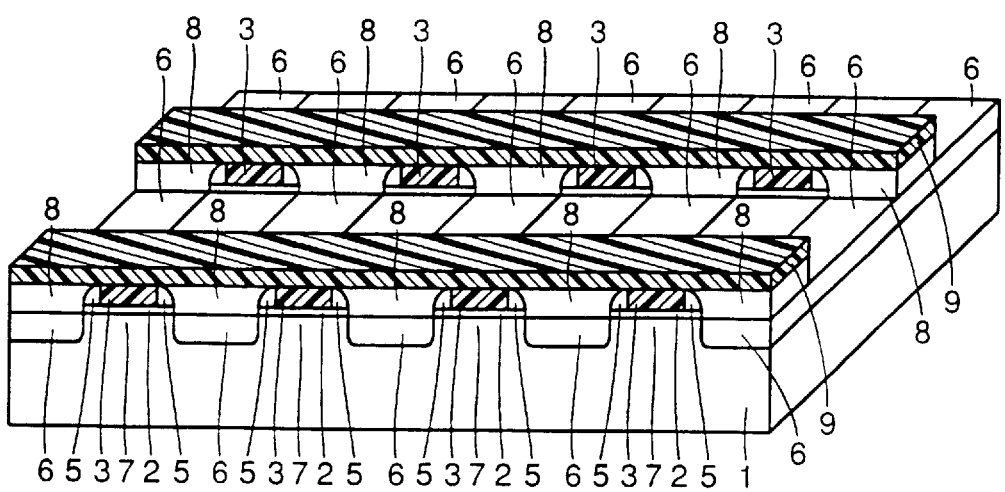

As shown in FIG. 3, an interlayer insulating film 8 is formed to cover first gate electrode 3, sidewall insulating layer 5 and n type diffusion region 6, and then a part of interlayer insulating film 8 on gate electrode 3 is removed. As a result, a flat interlayer insulating film 8 is formed as shown in FIG. 4. Thereafter, a second gate electrode 9 is formed on interlayer insulating film 8 and on first gate electrode 3. By photolithography and dry etching, second gate electrode 9, first gate electrode 3, sidewall insulating layer 5 and interlayer insulating film 8 are patterned to obtain a shape as shown in FIG. 5.

Figure 6:
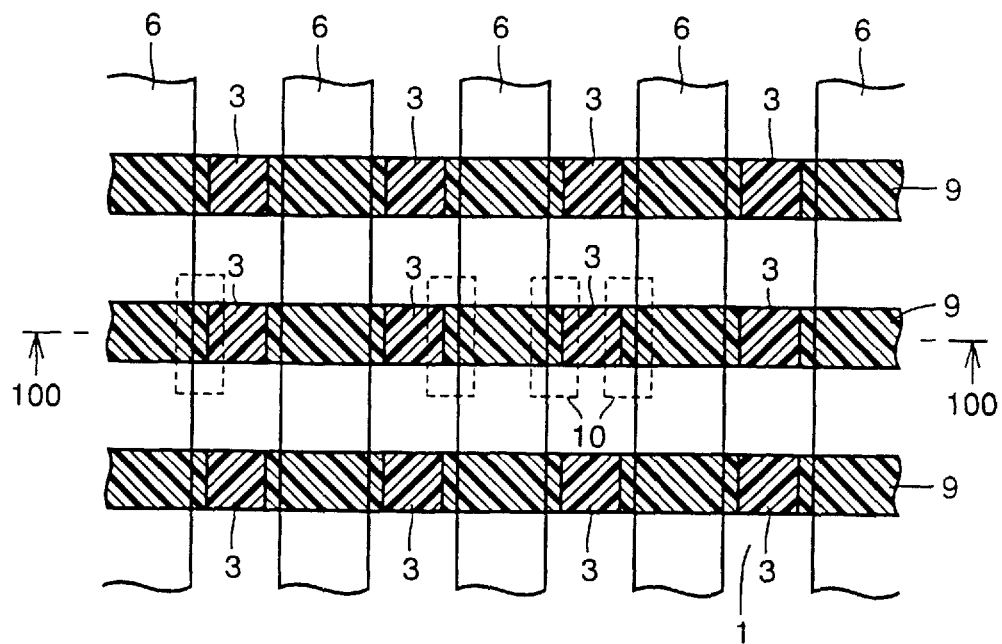
FIG. 6 is a plan view illustrating a sixth step of a process for manufacturing a memory cell array portion including an offset ROM of a semiconductor device in accordance with a first embodiment of the present invention.
Figure 7:
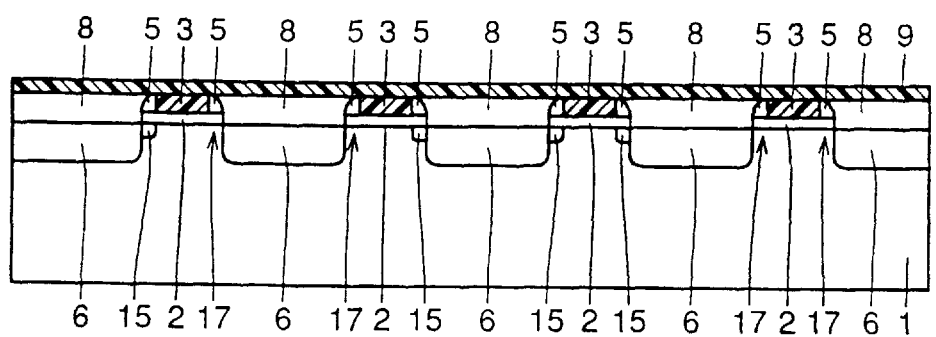
FIG. 7 is a cross sectional view taken along the line 100—100 in the step shown in FIG. 6.
Figure 8:
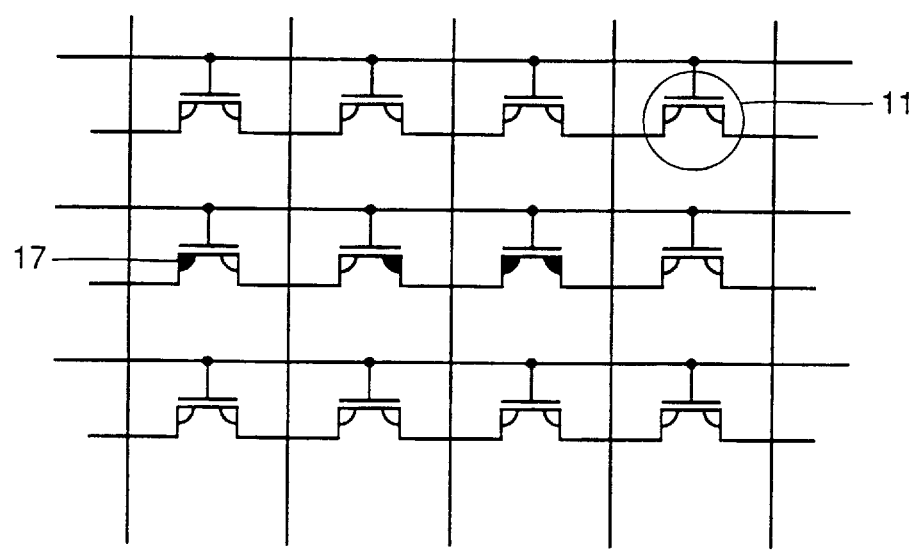
FIG. 8 is an equivalent circuit diagram showing the memory cell array portion of the semiconductor device in accordance with the first embodiment of the present invention.

Referring to FIG. 6, data is injected by implanting ions of n type impurity to a desired offset position by using a data injection mask 10. Consequently, an n type data injection region 15 as shown in FIG. 7 is formed, and whereby data is written. When impurity is implanted to a region shown as data injection region 10 in the step shown in FIG. 6, this impurity does not penetrate through first gate electrode 3, and therefore data injection region 15 is formed in a self-aligned manner by using first gate electrode 3 as a mask. Thus, data injection region 15 and n type diffusion region 6 constituting a source/drain region can be formed easily with good accuracy, thereby forming offset region 17 accurately. FIG. 7 is a cross sectional view taken along the line 100—100 in FIG. 6, and FIG. 8 is an equivalent circuit diagram of a memory array including an offset memory cell transistor shown in FIG. 6.

Figure 9:
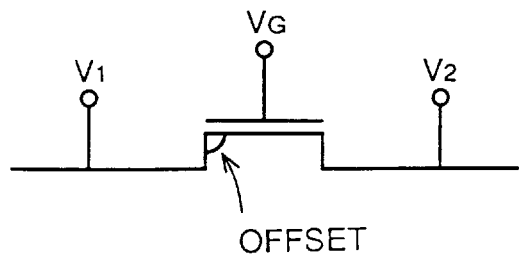
FIGS. 9 and 10 are an equivalent circuit diagram and a cross sectional view, respectively, illustrating operations of the offset ROM.
Figure 10:
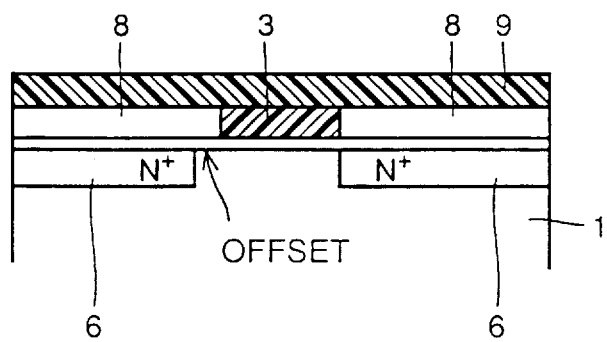
Figure 11:
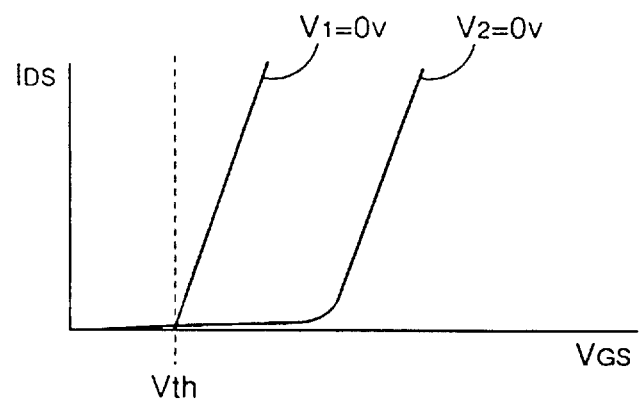
FIG. 11 shows a relation between the current-voltage characteristics of the offset ROM.

Referring to FIGS. 9–11, operations of an offset ROM will be described. If $V_1=0$ V, the offset transistor operates similarly to a common transistor as shown in FIG. 11. In other words, current Ids starts to flow when the voltage reaches a threshold voltage Vth. However, if readout operation is performed with $V_2=0$ V, a channel is not formed because there is an offset, and therefore no current flows through the offset transistor. In this embodiment, such an offset ROM is applied to a virtual GND NOR memory in which transistors are separated by ion implantation, thereby implementing a multi-value memory with a small memory array area.

Figure 12:
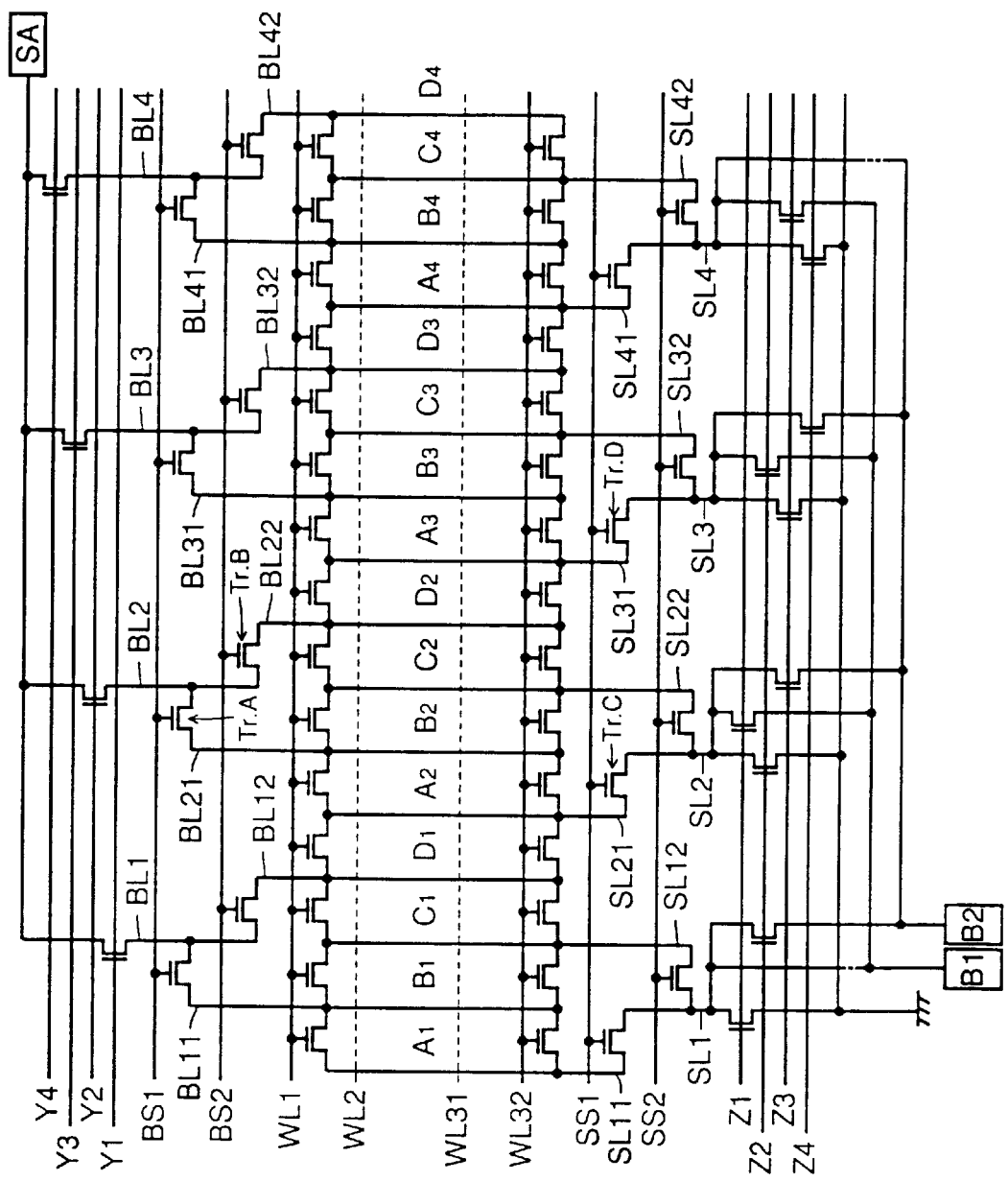
FIG. 12 is an equivalent circuit diagram showing a structure of a conventional virtual GND NOR memory.

Referring to FIG. 12, a readout method and a structure of a conventional virtual GND NOR memory will be described. In the virtual GND NOR memory, main bit lines BL1, BL2, BL3 and BL4 are connected to sub bit lines BL11 and BL12, BL21 and BL22, BL31 and BL32, and BL41 and BL42, respectively. Main source lines SL1, SL2, SL3 and SL4 are connected to sub source lines SL11 and SL12, SL21 and SL22, SL31 and SL32, and SL41 and SL42. Main bit lines BL1–BL4 are connected to a sense amplifier SA. Main source lines SL1–SL4 are connected to the ground. Main bit lines BL1–BL4 are selected by selection signals Y1–Y4. Sub bit lines BL11, BL12–BL41, BL42 are selected by selection signals BS1 and BS2. Main source lines SL1–SL4 are selected by selection signals Z1–Z4 to be connected to the ground. Sub source lines SL11, SL12–SL41, SL42 are selected by selection signals SS1 and SS2.

Referring to FIG. 12, a readout method will be described, regarding as a minimum unit a portion including BL2, BL21, BL22, SL21, SL22, SL31, SL2, and SL3 in the memory array. When BS1 is at an H level and BS2 is at an L (Low) level, a transistor A turns on, connecting main bit line BL2 to sub bit line BL21. Here, whether an $A_2$ column or a $B_2$ column is selected is determined by which one of SL21 and SL22 is selected. More specifically, when SS1 is at an H level and SS2 is at an L level, a transistor C turns on, connecting main source line SL2 to sub source line SL21, whereby $A_2$ is selected. When SS2 is at an H level and SS1 is at an L level, main source line SL2 is connected to sub source line SL22, thereby selecting $B_2$ column. By the combination of BS1, BS2, SS1 and SS2, any one of $A_2$, $B_2$, $C_2$ and $D_2$ columns can be selected. The sub source line and the sub bit line are thus selected.

The main bit line and the main source line are selected as follows. If the column to be selected is $A_2$, $B_2$ or $C_2$, main bit line BL2 and main source line SL2 are selected. If the column to be selected is $D_2$ column, main bit line BL2 and main source line SL3 are selected. More specifically, if the column to be selected is $A_2$–$C_2$, Y2 is set to be an H level and Z2 is set to be an H level, while Y2 is set to be an H level and Z3 is set to be an H level if the column to be selected is $D_2$. By such a selection, BL2 is connected to sense amplifier SA, and SL2 or SL3 is connected to GND to read out data. From one I/O, a memory cell group can be read out which is connected to the four main bit lines BL1–BL4 connected to one sense amplifier SA.

When data is read out from one transistor by selecting a word line, a sub bit line and a sub source line, leakage current may possibly be generated at the transistor adjacent to the selected transistor because a source/drain region is shared by neighboring memory transistors in this virtual GND NOR memory. If this occurs, the readout operation cannot be performed. Therefore, a bias voltage is applied using bias circuits B1 and B2 to non-selected main source lines adjacent to the selected main source line. For example, if the selected main bit line and main source line are BL2 and SL2, respectively, a bias voltage is applied to main source lines SL1 and SL3. Leakage current is thus prevented in order to perform data readout. In this embodiment, an offset ROM is combined with the memory array structure of the conventional virtual GND NOR memory having such a structure, thereby implementing a multi-value memory with a small memory array area.

Figure 13:
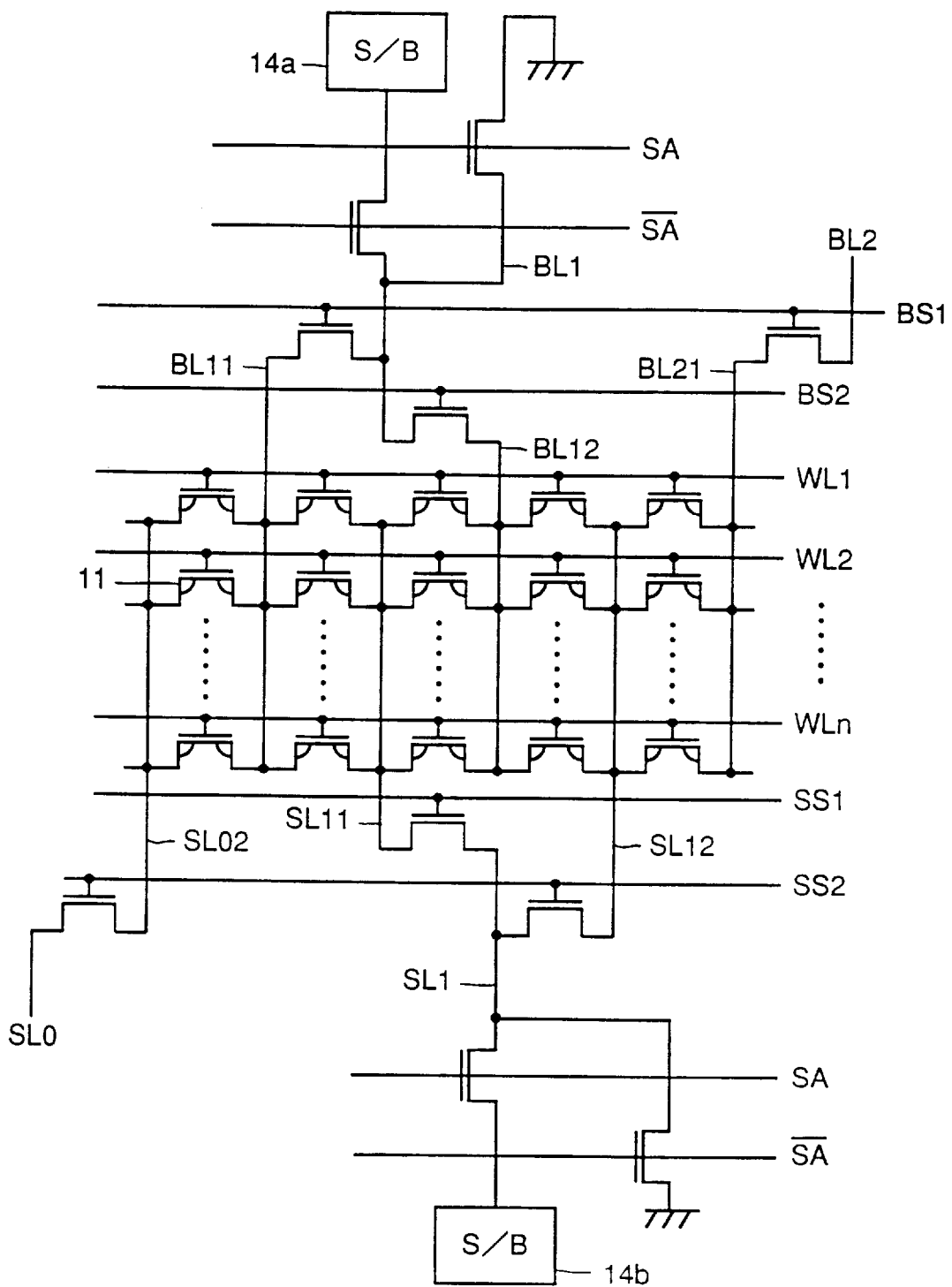
FIG. 13 is an equivalent circuit diagram showing a structure of a multi-value memory in accordance with the first embodiment of the present invention.
Figure 14:
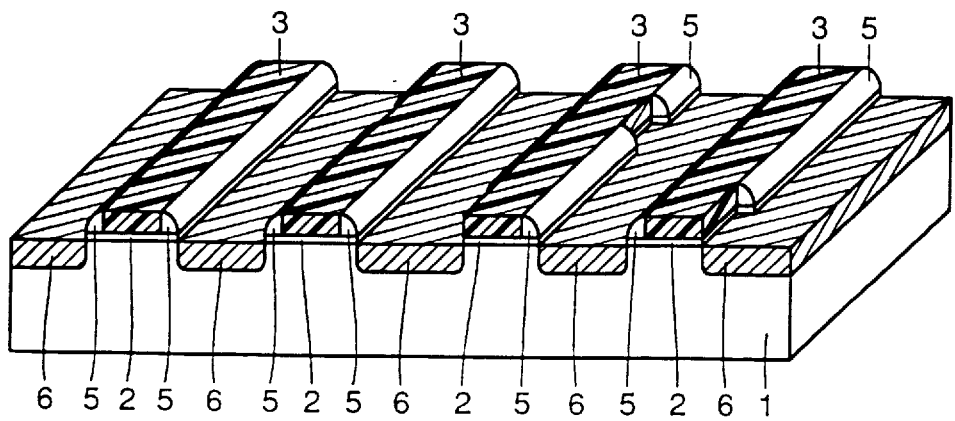
FIG. 14 is a perspective view illustrating a first step of a process for manufacturing a memory cell array portion of a semiconductor device in accordance with a second embodiment of the present invention.

Referring to FIG. 13, in the semiconductor device where an offset ROM is applied to a memory array structure of a virtual GND NOR memory in accordance with the first embodiment, circuits 14a and 14b each have one circuit serving both as bias circuit B1, B2 and sense amplifier SA of the conventional virtual GND NOR memory shown in FIG. 12. As a result, a bi-directional readout can be achieved by first using, for example, one circuit 14a, capable of serving both as a sense amplifier and a bias circuit, as a sense amplifier for charging a bit line and the other circuit 14b, also capable of serving as a sense amplifier and a bias circuit, as a bias circuit for charging a source line and then using the two circuits 14a and 14b in a reversed manner. The SA signal and /SA signal for circuit 14a shown in FIG. 13 correspond to signals Y1–Y4 shown in FIG. 12, and SA signal and /SA signal for circuit 14b correspond to signals Z1–Z4 shown in FIG. 12.

More specifically, as shown in FIG. 13, a memory cell 11 to be read out is selected by combination of sub bit line selection lines BS1 and BS2, sub source line selection lines SS1 and SS2, and word lines WL1–WLn. When the selected main bit line and main source line are, for example, main bit line BL1 and main source line SL1, SA signal and /SA signal determine whether each of main bit line BL1 and main source line SL1 is used as a bit line or a source line.

For example, if SA signal is set at an H level, /SA signal attains an L level, connecting main source line SL1 to circuit 14b and main bit line BL1 to the ground. Consequently, SL1 is used as a main bit line and BL1 is used as a main source line to read out data. Conversely, if /SA signal is set at an H level, SA signal attains an L level, and data is read out in a reversed manner, that is, readout operation is carried out by using SL1 as a main source line and BL1 as a main bit line. Thus, one transistor can be read out in two directions, thereby achieving multi-value readout. Circuits 14a and 14b are structured to have a switching means for switching whether each circuit is used as a sense amplifier or a bias circuit. As a result, when circuit 14a is connected to the selected main bit line BL1, circuit 14b applies a bias voltage to non-selected main source lines SL0 and SL2 (not shown) adjacent to the selected main source line SL1. If circuit 14b is connected to SL1 serving as a selected main bit line, circuit 14a applies a bias voltage to the non-selected BL0 (not shown) and BL2 adjacent to BL1 serving as a selected main source line. Consequently, generation of leakage current is prevented, whereby data of the selected transistor can be read out easily.

Referring to FIGS. 14–17, a process for manufacturing a memory array portion in accordance with a second embodiment will be described below.

Figure 15:
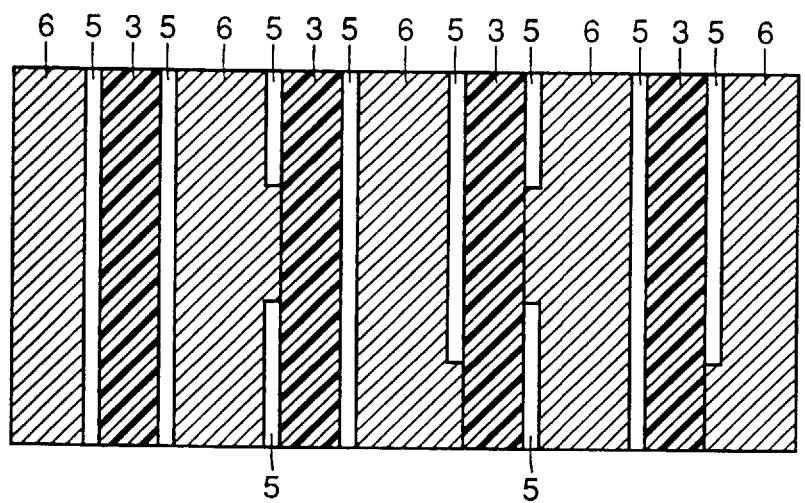
FIG. 15 is a plan view in the step shown in FIG. 14.
Figure 16:
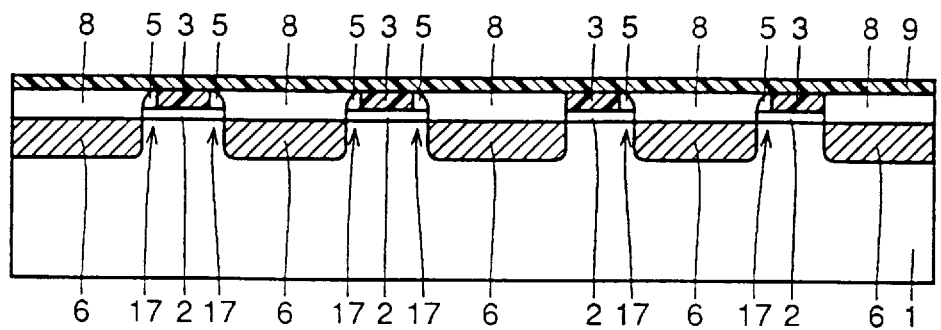
FIG. 16 is a cross sectional view illustrating a second step of a process for manufacturing the memory cell array portion of the semiconductor device in accordance with the second embodiment of the present invention.
Figure 17:
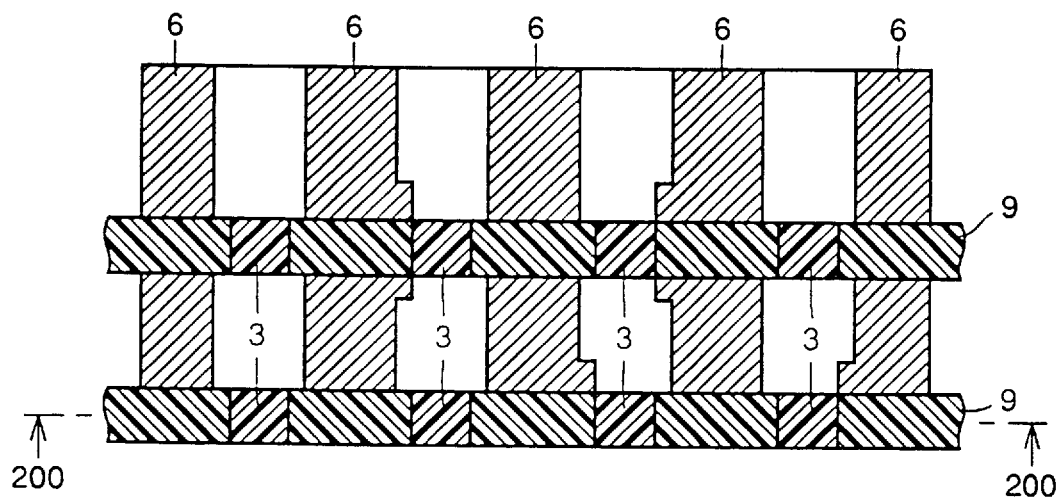
FIG. 17 is a plan view in the step shown in FIG. 16.

A process similar to the manufacturing process of the semiconductor device of the first embodiment in FIG. 1 is carried out to a point of forming first gate electrode 3 and sidewall insulating layers 5 in contact with both surfaces of first gate electrode 3. A portion of sidewall insulating layer 5 corresponding to a region where an offset region is not formed (data injection portion) is removed. Using the remaining sidewall insulating layer 5 and first gate electrode 3 as a mask, ions of n type impurity are implanted to p type semiconductor substrate 1, thereby forming n type diffusion region 6 constituting a source/drain region. FIG. 15 is a plan view of the state shown in FIG. 14. Thereafter, interlayer insulating film 8 and second gate electrode 9 are formed as shown in FIGS. 16 and 17.

In the second embodiment, a portion of sidewall insulating layer 5 corresponding to a region where offset 17 is not to be formed is removed before ion implantation for forming the source/drain region (n type diffusion region 6), so that source/drain region 6 and offset 17 can be formed easily in a self-aligned manner by ion implantation. Consequently, offset 17 and the source/drain region (n type diffusion region 6) can be formed with good accuracy. FIG. 16 shows a cross section taken along the line 200—200 in FIG. 17.

Figure 18:
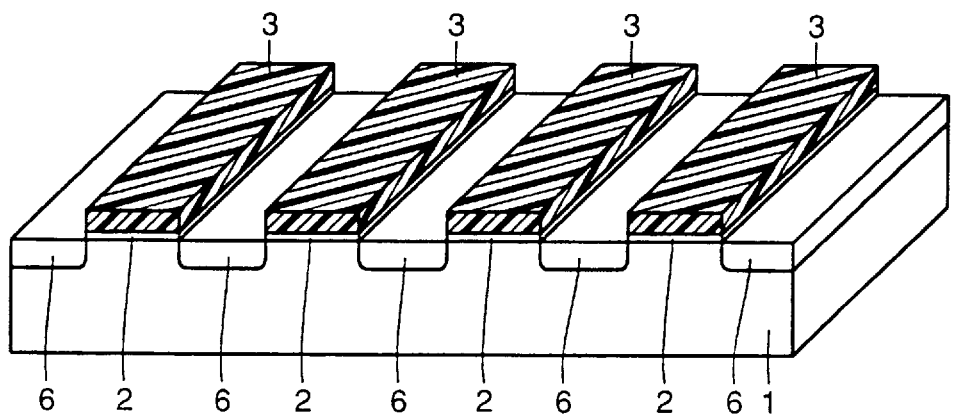
FIGS. 18 and 19 are perspective views illustrating first and second steps respectively of a process for manufacturing a memory cell array portion of a semiconductor device in accordance with a third embodiment of the present invention.
Figure 19:
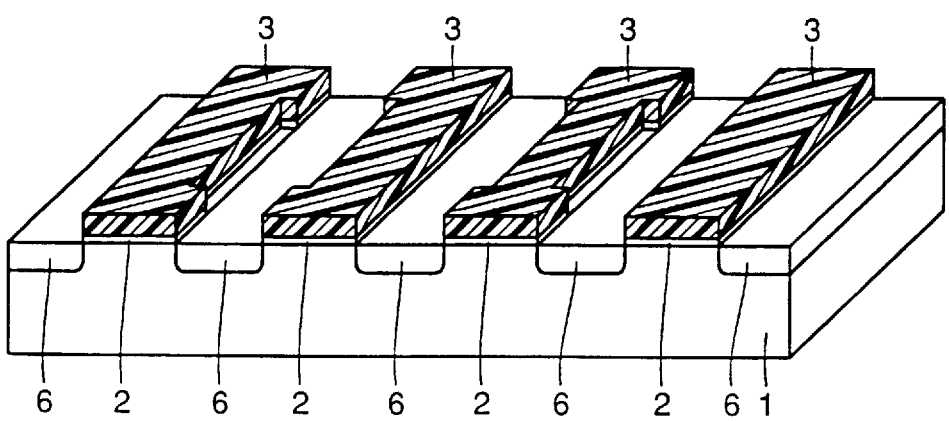
Figure 20:
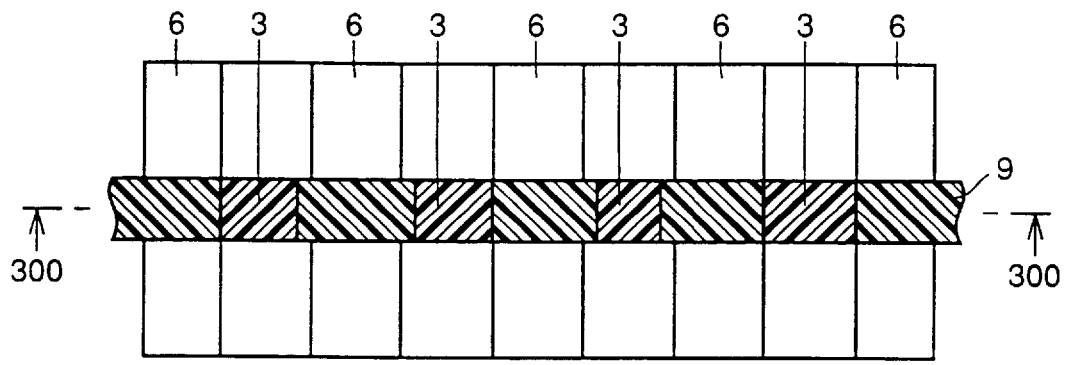
FIG. 20 is a plan view illustrating a third step of a process for manufacturing the memory cell array portion of the semiconductor device in accordance with the third embodiment of the present invention.
Figure 21:
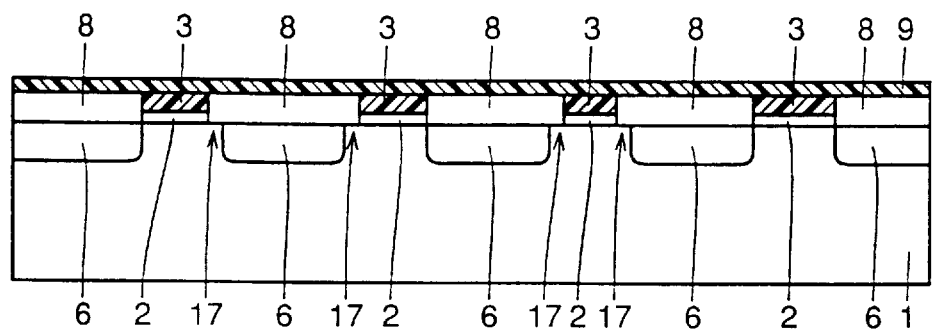
FIG. 21 is a cross sectional view taken along the line 300—300 in the step shown in FIG. 20.

Referring to FIGS. 18–21, a process for manufacturing a semiconductor device in accordance with a third embodiment will be described. As shown in FIG. 18, first gate electrodes 3 are formed with a prescribed distance therebetween on a main surface of p type semiconductor substrate 1 with gate insulating film 2 interposed therebetween. Using first gate electrode 3 as a mask, ions of n type impurity are implanted to p type semiconductor substrate 1 to form n type diffusion region 6 constituting a source/drain region. A portion of first gate electrode 3 corresponding to a region where an offset is to be formed is removed as shown in FIG. 19. Referring to FIGS. 20–21, interlayer insulating film 8 and second gate electrode 9 are then formed. FIG. 21 is a cross sectional view taken along the line 300—300 in FIG. 20. In this third embodiment, n type impurity region 6 constituting a source/drain region is formed in a self-aligned manner using first gate electrode 3 as a mask, and then offset 17 is formed, so that the source/drain region can be formed easily.

Figure 22:
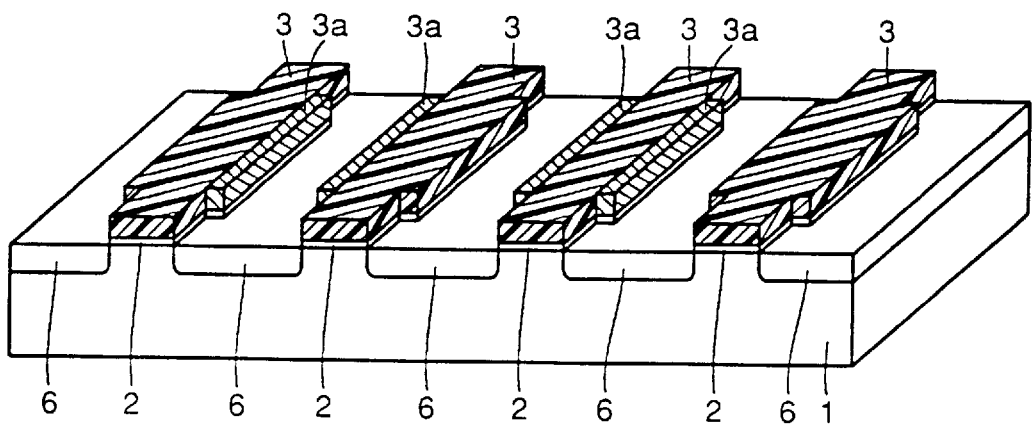
FIG. 22 is a perspective view illustrating a first step of a process for manufacturing a memory cell array portion of a semiconductor device in accordance with a fourth embodiment of the present invention.
Figure 23:
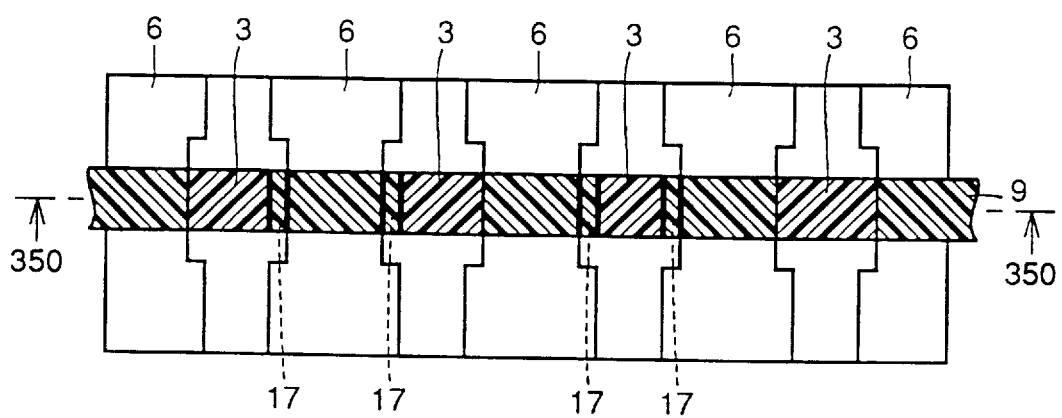
FIG. 23 is a plan view illustrating a second step of a process for manufacturing the memory cell array portion of the semiconductor device in accordance with the fourth embodiment of the present invention.

Referring to FIGS. 22 and 23, in accordance with the manufacturing process of a semiconductor device of a fourth embodiment, an offset is formed by removing a prescribed portion of first gate electrode 3 as in the third embodiment. In this fourth embodiment, the width of the first gate electrode in the direction of channel length, corresponding to a portion where first and second gate electrodes 3 and 9 are removed (a portion of channel region), is made greater in advance, as shown in FIG. 22. Under this state, ions of n type impurity are implanted to p type semiconductor substrate 1 using first gate electrode 3 as a mask, n type impurity region 6 constituting a source/drain region is formed. A portion 3a of first gate electrode 3 corresponding to a region where an offset is to be formed is the n removed, and then an interlayer insulating film (not shown) and a patterned second gate electrode 9 are formed. Consequently, n type diffusion region 6 constituting a source/drain region can be formed in a self-aligned manner and offset region 17 can also be formed easily. The cross sectional view taken along the line 350–350 of FIG. 23 is the same as the view of the semiconductor device of the third embodiment shown in FIG. 21.

Figure 24:
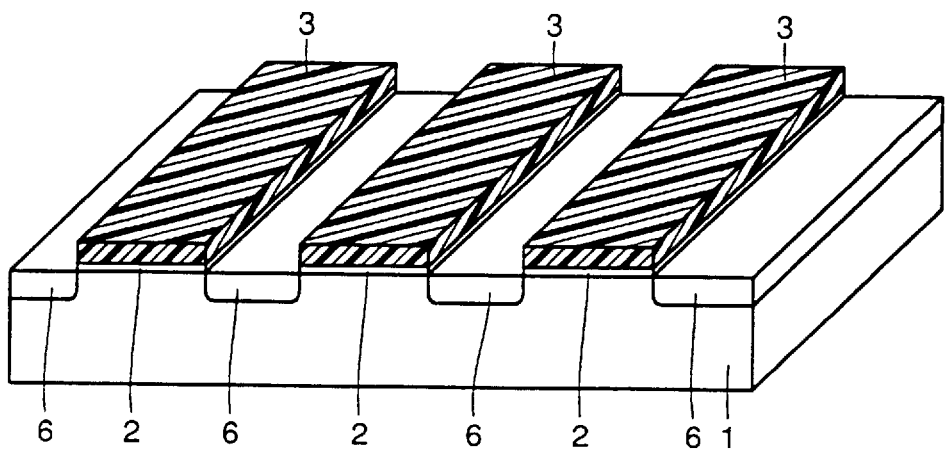
FIG. 24 is a perspective view illustrating a first step of a process for manufacturing a memory cell array portion of a semiconductor device in accordance with a fifth embodiment of the present invention.
Figure 25:
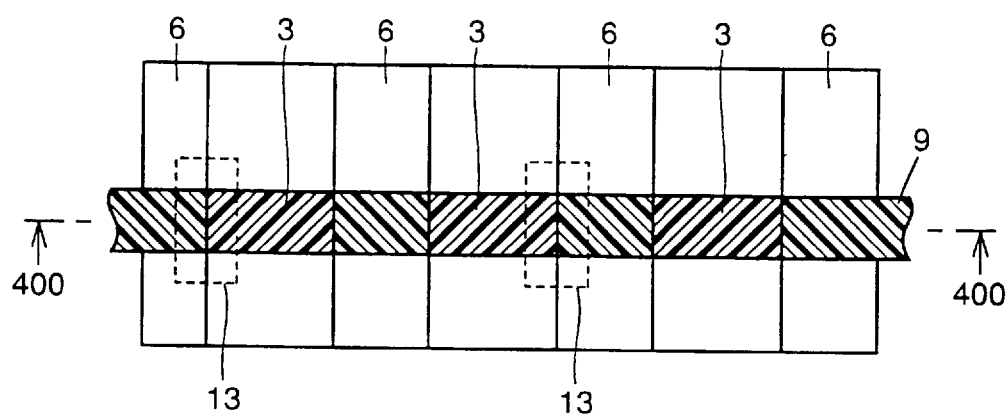
FIG. 25 is a plan view illustrating a second step of a process for manufacturing the memory cell array portion of the semiconductor device in accordance with the fifth embodiment of the present invention.
Figure 26:
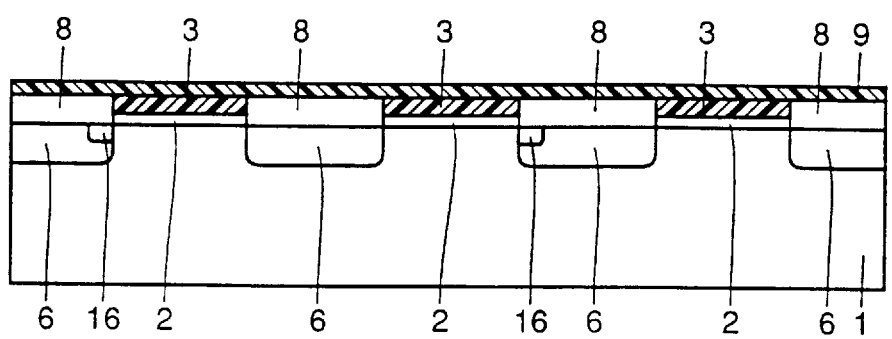
FIG. 26 is a cross sectional view taken along the line 400—400 in the step shown in FIG. 25.

Referring to FIGS. 24–26, a process for manufacturing a semiconductor device in accordance with a fifth embodiment will be described.

As shown in FIG. 24, first gate electrodes 3 are formed with a prescribed distance therebetween on p type semiconductor substrate 1 with gate insulating film 2 therebetween. Using first gate electrode 3 as a mask, ions of n type impurity are implanted to p type semiconductor substrate 1, thereby forming in a self-aligned manner n type diffusion region 6 constituting a source/drain region.

As shown in FIGS. 25 and 26, interlayer insulating film 8 and second gate electrode 9 are formed, and then second gate electrode 9, interlayer insulating film 8, first gate electrode 3 and gate insulating film 2 are patterned. Ions of p type impurity (boron, for example) are implanted to an offset injection region 13 using an offset injection mask as shown in FIG. 25. Since first gate electrode 3 is actually used as a mask, a p type offset region 16 is formed in a self-aligned manner as shown in FIG. 26. Thus, in this fifth embodiment, offset region 16 and n type diffusion region 6 constituting a source/drain region can be formed in a self-aligned manner by using first gate electrode 3 as a mask, so that regions 6 and 16 can be formed accurately.

Figure 27:
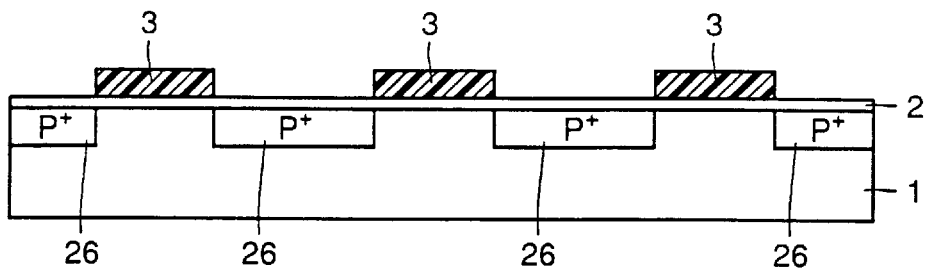
FIG. 27 is a cross sectional view illustrating a first step of a process for manufacturing a memory cell array portion of a semiconductor device in accordance with a sixth embodiment of the present invention.
Figure 28:
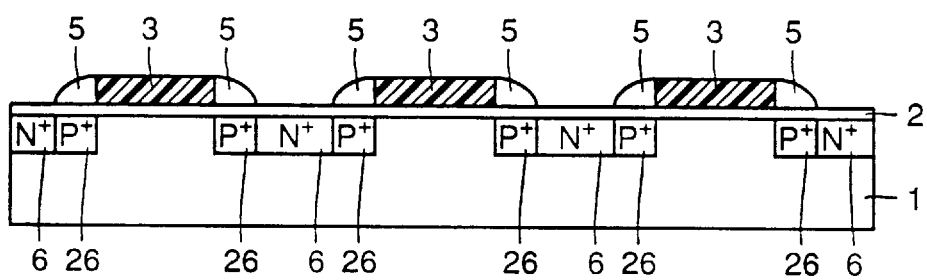
FIGS. 28 and 29 are plan views illustrating second and third steps, respectively, of a process for manufacturing the memory cell array portion of the semiconductor device in accordance with the sixth embodiment of the present invention.
Figure 29:
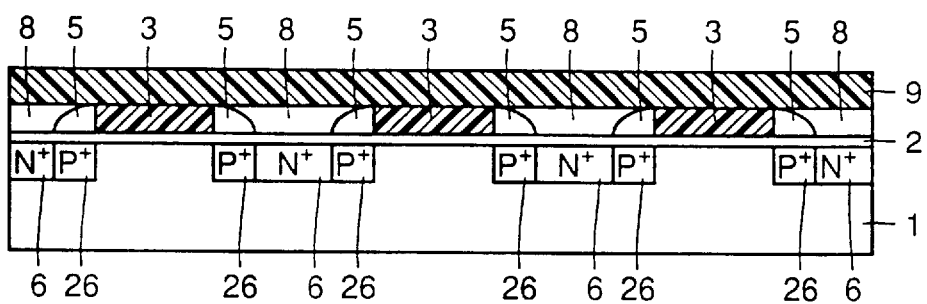
Figure 30:
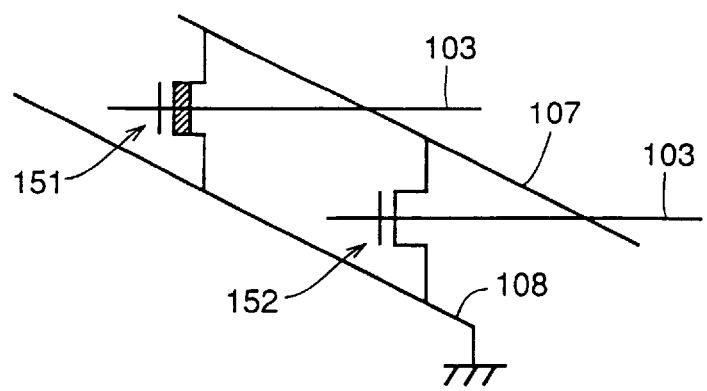
FIG. 30 is an equivalent circuit diagram showing a structure of a conventional NOR memory.
Figure 31:
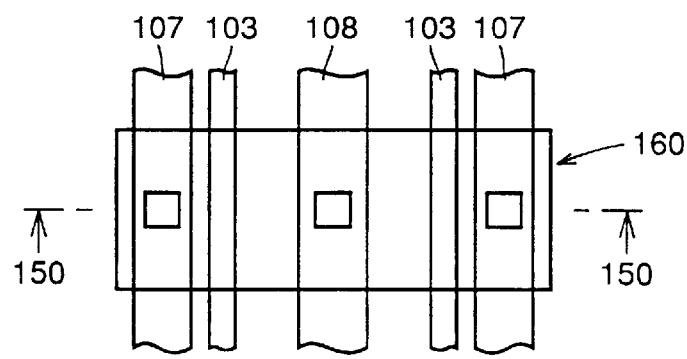
FIG. 31 is a plan view showing a memory cell portion of the conventional NOR memory.
Figure 32:
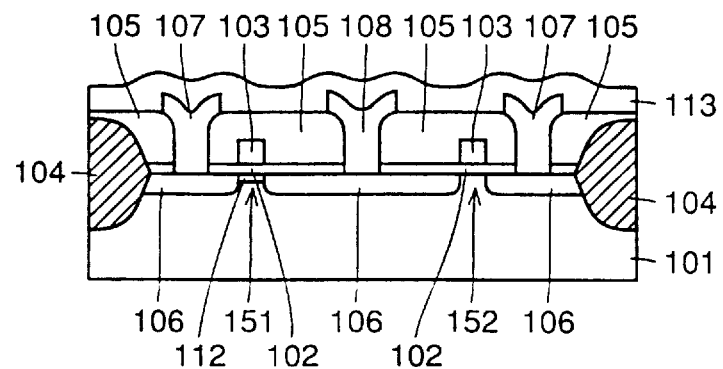
FIG. 32 is a cross sectional view taken along the line 150—150 shown in FIG. 31.
Figure 33:
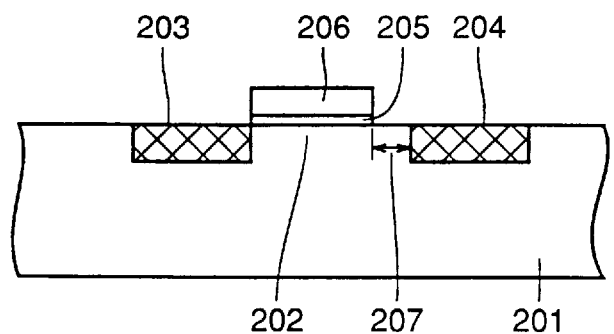
FIG. 33 is a cross sectional view showing a conventional offset transistor.

Referring to FIGS. 27–29, a process for manufacturing a semiconductor device in accordance with a sixth embodiment will be described. As shown in FIG. 27, a gate insulating film 2 is formed on a main surface of p type semiconductor substrate 1. First gate electrodes 3 are formed with a prescribed distance therebetween at a prescribed region on gate insulating film 2. Ions of p type impurity are implanted using first gate electrode 3 as a mask, thereby forming a p type diffusion region 26. With the process similar to the manufacturing process shown in FIGS. 1 and 2, sidewall insulating layers 5 in contact with both side surfaces of first gate electrode 3 are formed as shown in FIG. 28. Using first gate electrode 3 and sidewall insulating layer 5 as a mask, ions of n type impurity are implanted to p type semiconductor substrate 1. Thus, n type diffusion region 6 is formed constituting a source/drain region.

Thereafter, interlayer insulating film 8 and second gate electrode 9 are formed as shown in FIG. 29, and then second gate electrode 9, interlayer insulating film 8, and first gate electrode 3 are patterned. With the process similar to the manufacturing process of the first embodiment shown in FIG. 6, ions of n type impurity are implanted to the data injection region, thereby forming the data injection region (not shown).

In the sixth embodiment, offset region 26 and n type diffusion region 6 constituting a source/drain region can be formed in a self-aligned manner, so that these regions can be formed accurately.

The memory cell array including the offset ROM of the second through sixth embodiments can also be applied to the virtual GND NOR memory of the first embodiment shown in FIG. 13.

In a semiconductor device in accordance with one aspect of the present invention, an offset source/drain region is formed in a manner that a side end portion thereof is positioned substantially in flush with a lower end portion of an external surface of a sidewall insulating film, and a data injection layer is provided at a data injection portion between the first gate electrode and the offset source/drain region, whereby the offset source/drain region can be easily formed in a self-aligned manner using the sidewall insulating film as a mask and the data injection layer can also be easily formed in a self-aligned manner by ion implantation using the first gate electrode as a mask. Consequently, the offset source/drain region and the data injection layer can be formed accurately.

In the semiconductor device in accordance with another aspect of the present invention, the sidewall insulating film is formed in contact with a side surface of the first gate electrode only on the side corresponding to a region where an offset is formed, and a source/drain region is provided so that its side end portions are positioned in flush with the lower end portion of the external surface of the sidewall insulating film and with the side surface of the first gate electrode. As a result, the source/drain region and the offset region can be formed accurately in a self-aligned manner by ion implantation using the remaining sidewall insulating film and the first gate electrode as a mask.

In the semiconductor device in accordance with a further aspect of the present invention, the first gate electrode corresponding to an offset region has a shorter length in the direction of its channel length than the first gate electrode which does not correspond to an offset region, and source/drain regions are provided at a distance substantially equal to the length in the direction of the channel length of the first gate electrode which does not correspond to the offset region. Consequently, the offset region can be formed easily and the source/drain region can be formed accurately by forming the source/drain region in a self-aligned manner using first gate electrode as a mask and then forming the shorter first gate electrode.

In the semiconductor device in accordance with a further aspect of the present invention, the source/drain region is provided so that its side end portion is positioned in flush with the side surface of the first gate electrode, and the offset region is provided near the boundary region between the first gate electrode and the source/drain region. As a result, the source/drain region and the offset region can be formed in a self-aligned manner using the first gate electrode as a mask, thereby making it possible to form these regions accurately.

In the semiconductor device in accordance with a further aspect of the present invention, data of the first conductive line of the column selected by the column selection circuit is read out by the first readout circuit in response to the first readout indication signal, the second conductive line of the selected column is connected to the ground by the first ground circuit in response to the first readout indication signal, data of the second conductive line of the column selected by the column selection circuit is read out by the second readout circuit in response to the second readout indication signal, and the first conductive line of the selected column is connected to the ground by the second ground circuit in response to the second readout indication signal. As a result, data can be read out from both conductive terminals of the offset transistor to be read out. Thus, a multi-value memory with a small memory array area can be implemented in which an offset transistor and a virtual GND NOR memory are combined.

In the method of manufacturing a semiconductor device in accordance with a further aspect of the present invention, ions of impurity are implanted to the main surface of the semiconductor substrate using as a mask the sidewall insulating films on both side surfaces of the first gate electrode to form the offset source/drain region, and ions of impurity are implanted to the main surface of the semiconductor substrate through the sidewall insulating film using as a mask the first gate electrode in a data injection portion to form the data injection layer, so that the offset source/drain region and the data injection layer can be formed accurately in a self-aligned manner.

In the method of manufacturing a semiconductor device in accordance with a further aspect of the present invention, the sidewall insulating films are formed on both side surfaces of the first gate electrode, the sidewall insulating film on the side surface of the first gate electrode on the side corresponding to the data injection region is then removed, and the source/drain region is formed by using as a mask the remaining sidewall insulating film and the first gate electrode, whereby the source/drain region and the offset region can be formed accurately in a self-aligned manner.

In the method of manufacturing a semiconductor device in accordance with a further aspect of the present invention, the source/drain region is formed using the first gate electrode as a mask, and the sidewall portion of the first gate electrode corresponding to the offset formation region is removed to form the offset region. Consequently, the source/drain region can be formed accurately in a self-aligned manner and the offset region can be formed easily.

In the method of manufacturing a semiconductor device in accordance with a further aspect of the present invention, the source/drain region is formed by using the first gate electrode as a mask, ions of impurity are implanted near the side surface of the first gate electrode corresponding to the offset formation region so as to form the offset region. As a result, the source/drain region and the offset region can be formed accurately in a self-aligned manner.

In the method of manufacturing a semiconductor device in accordance with a further aspect of the present invention, the offset injection layer is formed using the first gate electrode as a mask, the source/drain region is formed by using as a mask the sidewall insulating films on both side surfaces of the first gate electrode, and the data injection region is formed by using the first gate electrode in the data injection portion as a mask. Consequently, the source/drain region, the offset injection layer and the data injection region can be formed accurately in a self-aligned manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a memory cell array including a plurality of offset memory cells arranged in row and column directions, each of which has one conductive terminal, another conductive terminal and a gate;

a word line connected to the gates of said memory cells in a row;

a first conductive line arranged corresponding to each column and connected to said one conductive terminals of said plurality of memory cells in the corresponding column;

a second conductive line arranged corresponding to each column and connected to the other conductive terminals of said plurality of memory cells in the corresponding column;

a column selection means for selecting one of a plurality of columns in accordance with a column selection signal;

a first sense amplifier/bias circuit responsive to a first readout indication signal for reading data of the first conductive line of the column selected by said column selection means;

a first ground means responsive to said first readout indication signal for connecting the second conductive line of said selected column to the ground;

a second sense amplifier/bias circuit responsive to a second readout indication signal for reading data of the second conductive line of the column selected by said column selection means; and a second ground means responsive to said second readout indication signal for connecting the first conductive line of said selected column to the ground.

2. The semiconductor device according to claim 1, wherein said first sense amplifier/bias circuit includes a first bias means for applying a bias voltage to the first conductive line of the columns positioned on both sides of said selected column when said second sense amplifier/bias circuit reads out data of said second conductive line, and said second sense amplifier/bias circuit includes a second bias means for applying a bias voltage to the second conductive line of the columns positioned on both sides of said selected column when said first sense amplifier/bias circuit reads out data of said first conductive line.

* * * * *